United States Patent [19]

Ahmed

[11] 4,417,240

[45] Nov. 22, 1983

[54] PLURAL OUTPUT SWITCHED CURRENT AMPLIFIER AS FOR DRIVING LIGHT EMITTING DIODES

[75] Inventor: Adel A. A. Ahmed, Clinton Township, Hunterdon County, N.J.

[73] Assignee: RCA Corporation, New York, N.Y.

[21] Appl. No.: 153,629

[22] Filed: May 27, 1980

[51] Int. Cl.³ .............................................. G09G 3/00
[52] U.S. Cl. ................................... 340/782; 340/753; 340/761; 307/270; 330/278; 330/307
[58] Field of Search ............... 330/278, 282, 288, 307; 307/254, 270, 311; 340/761, 762, 753, 754, 782

[56] References Cited

U.S. PATENT DOCUMENTS

| | | | |
|---|---|---|---|
| 3,681,619 | 8/1972 | Remy | 307/254 |
| 4,017,847 | 4/1977 | Burford et al. | 340/761 |
| 4,064,506 | 12/1977 | Cartwright, Jr. | 340/347 DA |
| 4,103,246 | 7/1978 | Limberg | 330/278 |
| 4,117,416 | 9/1978 | Schade, Jr. | 330/282 |
| 4,117,417 | 9/1978 | Ahmed | 330/288 |
| 4,119,924 | 10/1978 | Ahmed | 330/288 |
| 4,160,944 | 7/1979 | Ahmed | 323/4 |
| 4,177,392 | 12/1979 | Haferl | 307/254 |
| 4,234,805 | 11/1980 | Carlsen | 307/270 |
| 4,289,977 | 9/1981 | Powers et al. | 307/270 |
| 4,291,242 | 9/1981 | Schriber | 307/270 |

OTHER PUBLICATIONS

Handbook of Semiconductor Electronics, Hunter; 3rd Ed.; McGraw-Hill.

Primary Examiner—Marshall M. Curtis
Attorney, Agent, or Firm—E. M. Whitacre; P. J. Rasmussen; A. J. Jacobson

[57] ABSTRACT

A plural-output switched current source, as may be used to provide current drive to inidividual display segments of an LED display. Each respective current source output is selectively operable from a respective low level I²L signal source. Means are provided to reduce the tendency of the selective operation of one LED display segment to affect the brightness of the remaining LED display segments.

17 Claims, 5 Drawing Figures

PLURAL OUTPUT SWITCHED CURRENT AMPLIFIER AS FOR DRIVING LIGHT EMITTING DIODES

FIELD OF THE INVENTION

This invention relates to switched current drivers having a plurality of outputs, as may be used, for example, to drive light emitting diodes (LED's).

Certain types of load devices require substantially constant current drive, which current drive must be selectively enabled and disabled from a low level signal source. For example, an LED requires constant current for constant brightness at a given temperature. When used as an individual display segment, an LED must be operated at substantially the same current level as the other LED display segments in order to insure uniform display brightness. Further, when an LED is driven by integrated injection logic ($I^2L$) circuits, it is necessary to control a relatively high level current drive (for example, 20 millamperes) to the LED by a relatively low level signal current source (for example, 15 microamperes).

One approach to providing an LED driver is to use a saturating output transistor in series with a current limiting resistor to the LED load. Such arrangement is unsatisfactory, particularly in the case of battery-powered equipment when battery voltage, and therefore display luminance, varies over the life of the battery.

Another approach to providing an LED driver is to fabricate a sensing resistor in series with the emitter of an output transistor for applying degenerative current feedback to regulate the output current to a predetermined value. However, such approach requires a higher supply potential because of the presence of the sensing resistor. Furthermore, when the sensing resistor is fabricated in integrated circuit form, it is difficult to accurately control the low resistance value required (e.g. 35 ohms), without using excessive integrated circuit area.

Yet another approach to providing an LED display driver is to use a current mirror amplifier (CMA) having a single master mirroring transistor and a plurality of slave mirroring transistors wherein the master transistor is conditioned by a direct collector-to-base feedback connection to conduct a substantially constant reference current and each respective LED is driven by a respective slave transistor. The reference current is input to the collector electrode of the master transistor. To the extent that the transfer characteristics of the master and slave transistors match and track each other, by virtue of being fabricated on a common substrate by the same manufacturing process, the output current of the respective slave transistors will tend to be proportional to the current in the master transistor.

In a switched CMA known in the prior art, field-effect transistors (FET) are used as series switch means to apply the base-emitter voltage ($V_{BE}$) of the master transistor to the base-emitter junction of a slave transistor for conditioning it to conduct a respective collector-emitter current substantially proportional to that of the master transistor. Each slave transistor, when connected to the master transistor, draws its base current from the input reference current supply to the master transistor of the CMA, which undesirably affects the output current in the remaining slave transistors.

In another switched current mirror amplifier known to the inventor, the base electrode of each respective slave transistor is connected to the base electrode of the master transistor by a respective resistor. Each slave transistor is thus continuously enabled. To disable each slave transistor, a respective switch means is provided for selectively connecting the base electrode of a respective slave transistor to the emitter electrode thereof. Each respective resistor provides isolation so that the operation of one switch means will not disable all of the slave transistors. However, the operation of each switch means causes a portion of the input reference current supply to be shunted away from the master transistor thereby adversely affecting the output current in the remaining slave transistors. Furthermore, the base current drive for each respective slave transistor, which must be shunted by each respective switch means, is typically too large (e.g. 2 milliamperes) to be switched directly by the output transistor of a low level $I^2L$ gate.

From the foregoing discussion, it can be seen that in a bipolar plural output switched current source for driving respective constant current LED display segments from respective $I^2L$ signal sources, it is desirable to provide means such that as successive slave transistors are selectively enabled or disabled, the change in the input reference current supplied to the master transistor is not large enough to significantly change the output current in the other slave transistors, which change effects the brightness of the LED display.

SUMMARY OF THE INVENTION

The present invention in one of its aspects is embodied in a bipolar plural output CMA having slave output transistors which can be selectively enabled and disabled from a respective low level signal source, wherein the output current from each slave transistor selectively provides drive current to an LED display, which drive current is substantially independent of the selective operation of the other slave transistors.

The present invention in another of its aspects is embodied in a current amplifier having an input terminal at the collector of a master transistor and a plurality of output terminals at the respective collectors of a plurality of slave transistors. The respective emitters of the master and slave transistors connect to a common terminal. A first resistor connects at one end to circuit node and at the other end to the base of a first additional transistor to provide forward biasing current thereto. The emitter of the first additional transistor connects to the base of the master transistor. Respective further additional transistors receive forward biasing current through respective resistors connected at one end to the circuit node and at their respective other ends to the bases of the respective additional transistors. The emitter electrodes of the respective additional transistors each connect to the base of a respective one of the slave transistors. A device connects to the respective bases of the further additional transistors for selectively diverting their forward biasing current.

A direct coupled feedback means is provided between collector electrode of said master transistor and the circuit node for conditioning the master transistor to conduct an input reference current applied to its collector electrode.

DETAILED DESCRIPTION

Figure 1:
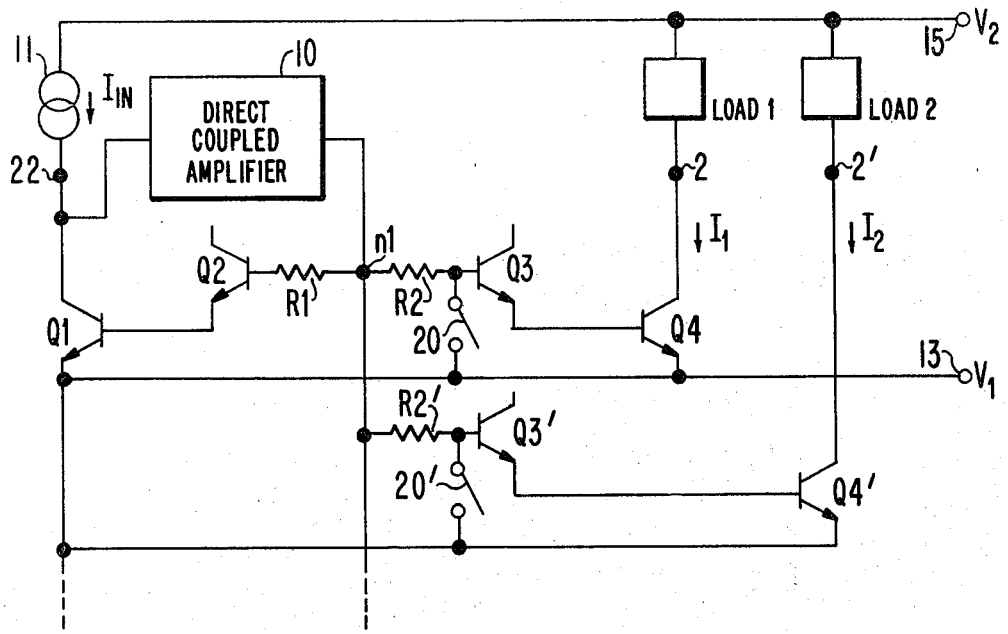
FIG. 1 is a schematic diagram, partially in block form, showing a plural output switched amplifier in accordance with the present invention.

A switched CMA is shown in FIG. 1. Generally, a CMA is defined as: current-to-voltage converter means responsive to an input current for producing a voltage; voltage-to-current converter means responsive to said voltage for producing an amplifier output current and wherein each converter exhibits a respective current-/voltage characteristic, which may be non-linear, said characteristics being related by a factor G independent of the magnitude of the current being amplified and being selected to track each other with changes in temperature for providing an overall amplifier gain wherein the ratio of output current to input current magnitude equals the factor G over substantial ranges of both temperature and the magnitude of the amplified current.

Figure 3:
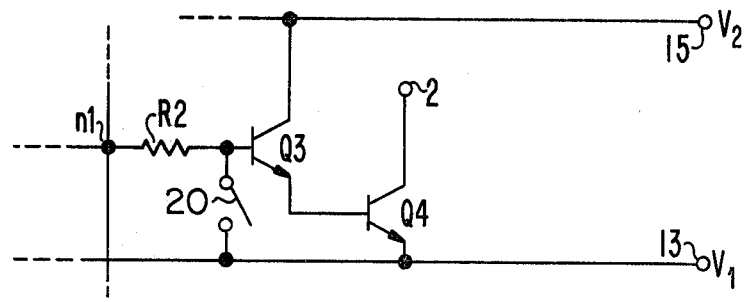
FIGS. 3 and 4 are each alternate embodiments of an output stage for the switched current mirror amplifier of FIG. 1.
Figure 4:
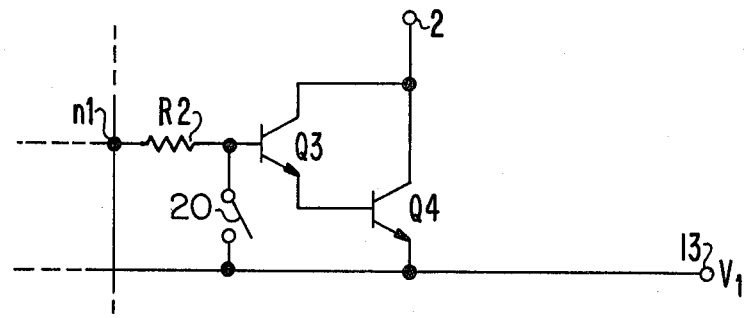

In FIG. 1, the current-to-voltage converter means comprises a master transistor Q1, a direct-coupled amplifier 10, a resistor R1, and a first additional transistor Q2. The voltage-to-current converter means comprises a slave transistor Q4, a resistor R2, and a further additional transistor Q3. A switch means 20 having terminals connected between the base electrode of Q3 and the emitter electrode of Q4 is provided, which switch means is responsive to a first level of control signal to selectively conduct current between its terminals. The collector electrodes of transistors Q2 and Q3, shown unconnected in FIG. 1, are either connected to node n1 (FIG. 2), or to a source of operating potential $V_2$ (FIG. 3), or to the collector electrodes of transistor Q1 and transistor Q4, respectively (FIG. 4). The respective emitters of master transistor Q1 and of slave transistors Q4 and Q4' connect to terminal 13 which is at potential $V_1$.

In operation, an input current $I_{IN}$ is provided to terminal 22 by current source 11. Node n1 is established at a potential which conditions transistor Q1 (via resistor R1 and transistor Q2) to conduct $I_{IN}$. The potential at node n1 is applied to the base electrode of Q3 via resistor R2, assuming that switch means 20 is non-conductive. Transistor Q3 provides emitter current which conditions Q4 to conduct an output current $I_1$ at terminal 2, which output current is proportionally related to the input current $I_{IN}$. For example, assume transistors Q1 and Q4 are equal in size and have matching transfer characteristics. The potential at node n1 which provides base drive to Q1 also provides the same base drive to Q4 thereby producing an output current $I_1$ essentially equal to the input current $I_{IN}$. When switch means 20 is conductive, the combined $V_{BE}$ of transistor Q3 and transistor Q4 is reduced so that the output current $I_1$ becomes substantially zero.

The CMA of FIG. 1 further includes a second voltage-to-current converter means as indicated by Q4', R', 20', and Q3', providing a second output current $I_2$ at terminal 2'. In similar manner, additional output stages may be added to node n1. Output currents $I_1$ and $I_2$ are conducted between output terminals 2, 2' and terminal 15 by LOAD 1 and LOAD 2, respectively.

Figure 2:
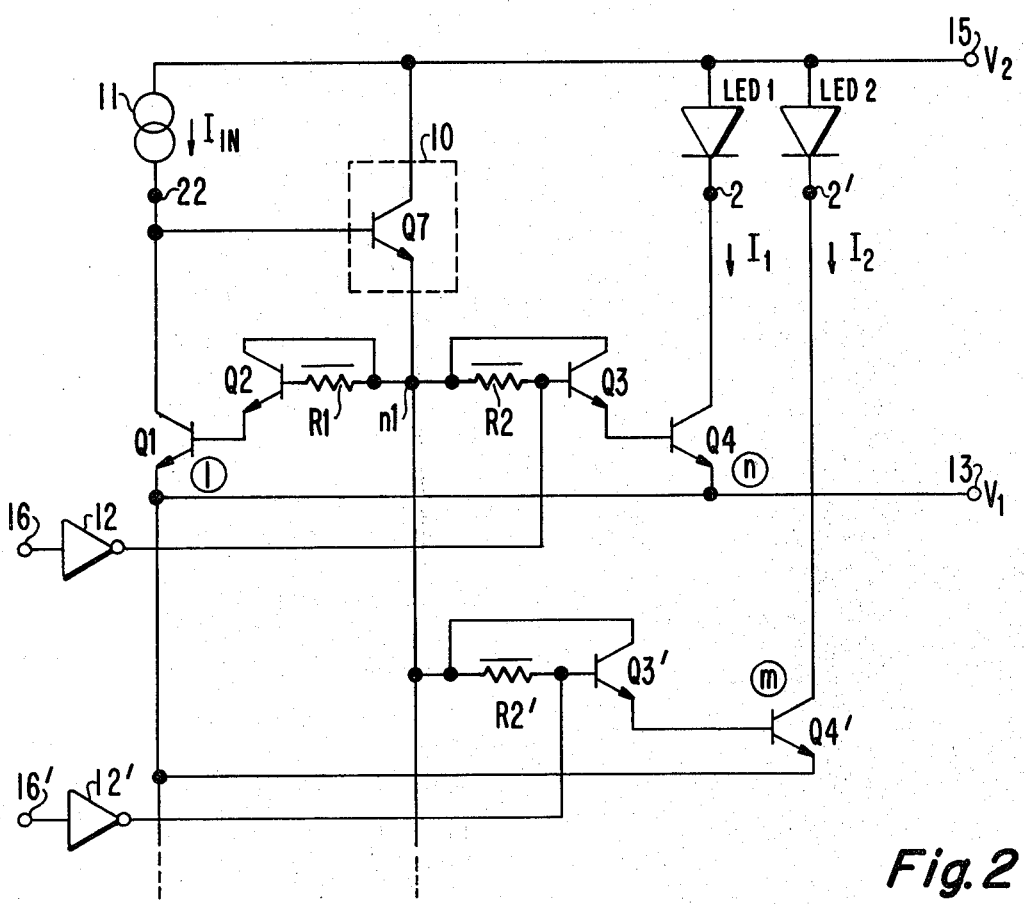
FIG. 2 is a schematic diagram of an embodiment of a plural output switched amplifier used for driving LED load devices, and embodying the present invention.

A specific embodiment of a plural output switched CMA used for driving an LED display is shown in FIG. 2. Direct-coupled amplifier 10 comprises transistor Q7 arranged as an emitter follower amplifier between terminal 22 and node n1. Each slave output stage Q4 and Q4' is connected to one end of a respective LED load. The other end of each LED load is connected to an operating potential $V_2$ at terminal 15.

Switch means 20 from FIG. 1 is shown as an $I^2L$ logic inverter 12. The $I^2L$ inverter 12 provides an open collector transistor output for selectively connecting the base electrode of transistor Q3 to terminal 13 (at potential $V_1$) responsive to a first logic level of control signal at terminal 16.

In operation, a reference current is provided to input terminal 22. The reference current $I_{IN}$ may be supplied from a substantially constant current source 11 for constant display brightness. By providing means for adjusting the reference current $I_{IN}$, the display brightness can be adjusted by the user, or alternatively, by providing means for varying $I_{IN}$ responsive to a light sensor, the display brightness can be made adaptive to ambient light conditions.

The potential at node n1 causes a base current to flow in transistor Q2 via resistor R1. Such base current is amplified by the beta (common emitter forward current gain) of transistor Q2 and added thereto for providing base current to transistor Q1. As a result of the feedback from Q1 collector to node n1 via transistor Q7, transistor Q1 is conditioned to conduct all of the input reference current $I_{IN}$ except for a negligibly small current flowing as base current to Q7.

When the control signal at terminal 16 is at a second logic level, wherein the open collector output of inverter 12 is in a high impedance state, the potential at node n1 also causes a base current to flow in transistor Q3 via resistor R2. Such base current is amplified by the beta of transistor Q3 and added thereto providing base current to transistor Q4. Transistor Q4 is conditioned to conduct an output current $I_1$ through LED 1 causing it to emit light.

When the control input 16 to inverter 12 is at a first logic level, wherein the open collector output of inverter 12 is rendered conductive, the potential at the base electrode of Q3 begins to drop. As the combined $V_{BE}$ of transistors Q4 and Q3 become sufficiently small, transistor Q4 becomes essentially non-conductive, extinguishing the light output from LED 1.

If the output transistor of inverter 12 is an ideal switch, having substantially zero resistance when conductive, then the $V_{BE}$ of Q4 will go to zero. In that event, the switch current through inverter 12 is determined by the value of resistor R2 and the voltage at node n1. However, precisely because the additional transistor Q3 provides current gain, resistor R2 can be made larger than otherwise possible. Therefore, the amount of base current which inverter 12 must sink is correspondingly reduced. On the other hand, the potential at node n1 is about twice the forward biased voltage drop ($2V_{BE}$) because of the presence of the additional transistors Q2, Q3, Q3'. Therefore, the actual reduction factor in current carrying requirements for inverter 12 is proportional to one-half the current gain of transistor Q3.

The $I^2L$ output transistor of inverter 12 need not be a perfect switch: it may have a finite series resistance, or be connected as a constant current source switched on and off by the control signal at terminal 16. The real requirement is that inverter 12 output must sink sufficient current through resistor R2 so that the potential at the base electrode of transistor Q3 is sufficiently reduced, thereby providing a sufficiently small output current $I_1$ from transistor Q4 which extinguishes the light output from LED 1. Toward this end, the gain provided by transistor Q3 reduces the current sink requirement of inverter 16.

The low current sink requirement for inverter 12 permits direct drive by low level I²L logic gates. Such feature is especially useful for wired OR logic where more than one I²L logic element is directly connected to the base electrodes of transistor Q3. The operation of additional slave output stages, i.e., Q4', Q3', R2', 12', 16' is analogous to operation of the slave output stage described above by supplying curent I2 to LED 2 via terminal 2'.

When a slave output stage is enabled, it draws a particular level of current from node n1. When such output stage is selectively disabled as described above, it draws a somewhat different current from node n1, which tends to adversely change the current in the other slave output stages. The circuit of FIG. 2 has several features which reduce such output stage interaction.

First, the resistors R2, R2' connected to node n1 can be made larger because of the presence of the additional transistors Q3, Q3', which provide greater isolation between output stages. Increased resistor R2, R2' values are further consistent with the goal of reducing the current sink requirements of the logic inverters 12, 12'. The maximum resistance value of the series resistors R2, R2', is determined by the minimum base current drive required by the respective additional transistors Q3, Q3' for adequately driving its respective slave output transistors Q4, Q4'.

Second, the collector current of additional transistor Q3 is supplied from node n1. Therefore, while selective operation of inverter 12 for disabling slave transistor Q4 tends to increase current through series resistor R2, there is a counterbalancing decrease in current through the collector-emitter path of transistor Q3. By appropriate choice of electrical component values, the net change in current drawn from node n1 as a result of selectively disabling a slave output transistor Q4 can be minimized. The relationship between circuit parameters for which there is essentially no change in current drawn from node n1 is approximately given by $R2 = \beta(2 V_{BE}/I_{OUT})$, where $\beta$ is the beta of transistor Q4. Therefore, if $\beta$ is known, a value for R2 can be selected for the desired output current $I_{OUT}$.

Furthermore, resistor R1, R2, R2' may be fabricated in integrated circuit form as a pinch resistor by methods known to those skilled in the art. Pinch resistors are indicated in FIG. 2 by the horizontal lines adjacent the resistance symbols. The use of a pinch resistor tends to compensate for process-related variations in $\beta$ because the value of a pinch resistor is directly proportional to the $\beta$ of the transistors on the same integrated circuit substrate. If the ratio $R2/\beta$ for Q4 can be held to a constant value, equal to $2 V_{BE}/I_{OUT}$, then each slave path will draw essentially the same current from node n1 when it is enabled as it does when it is disabled. In such case, direct coupled amplifier 10 may be replaced by a direct connection having no substantial intervening impedance.

Finally, the use of direct coupled amplifier 10 provides current gain between the collector electrode of transistor Q1 and node n1. Therefore, the effect of any changing current demands at node n1, with regard to diverting a portion of input reference current from master transistor Q1 to supply such changing demand, is reduced by a factor proportionally related to the current gain of transistor Q7.

The magnitude of output current to input reference current ratio may be scaled by choice of the respective emitter-base junction area ratio of master transistor Q1 and slave transistor Q4 (shown as 1:n in FIG. 2). Thus, the required reference current may be small compared to the output current level, a useful feature permitting relatively high peak output current when multiple LED displays are used in a scanning mode. In such case, each LED segment is strobed for a short time but with a higher instantaneous current. Also, LED display segments requiring a higher output current or a lower output current for uniform brightness (as in the case of a decimal point for example) are easily accommodated by appropriate choice of emitter-base junction area of the respective output slave path transistor (e.g., 1:m ratio for Q1:Q4' in FIG. 2). Respective additional transistors and series resistors are scaled accordingly.

In FIG. 2, transistor Q7 also supplies the collector current of additional transistors Q3, Q3', which respective collector electrodes are connected to node n1. FIGS. 3 and 4 show alternative slave output stages wherein the collector electrode of the added transistor Q3 is not connected to node n1. In FIG. 3, the collector electrode of transistor Q3 is connected to a source of operating potential, which may for example be potential V2 at terminal 15. For such arrangement, the change in collector current of Q3 does not compensate for the change in current from node n1 through resistor R2 as previously described. In FIG. 4, the collector electrode of transistor Q3 is connected to the collector electrode of output transistor Q4 in a Darlington configuration. The latter configuration is less desirable because the output voltage at the collector electrode of transistor Q4 in FIG. 4 cannot go below a $V_{BE}$ which reduces the voltage available for driving the LED load.

Figure 5:
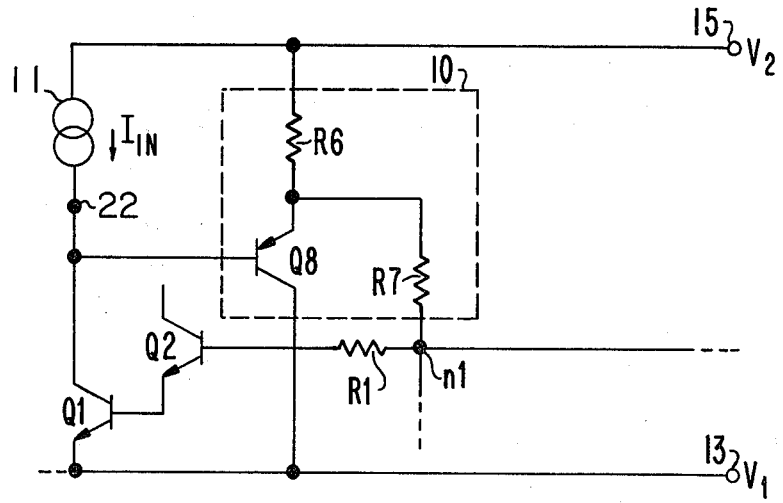
FIG. 5 is an alternate embodiment of the direct coupled amplifier of FIG. 1.

An alternate embodiment for the direct coupled amplifier 10 is shown in FIG. 5. Transistor Q8 and resistors R6, R7 provide current gain between the collector electrode of transistor Q1 and node n1. Resistor R7 can be replaced by a forward-biased diode or by a direct connection without substantial intervening impedance. However, resistor R6 should be chosen small enough to supply all current requirements expected at node n1 under the worst case conditions. Emitter follower action via transistor Q8 establishes node n1 at such potential so as to condition transistor Q1 to conduct the input reference current $I_{IN}$. The tendency for changing current demands at node n1 to divert a portion of the input reference current away from master transistor Q1, is reduced by the beta of transistor Q8.

Although the plural output switched current amplifier of the present invention has been shown for use with LED loads, it will be appreciated that the same circuit may be used for driving other types of load devices.

What is claimed is:
1. A switched current amplifier comprising:
 a master transistor having respective emitter, base and collector electrodes;

a plurality of slave transistors, having respective emitter, base and collector electrodes;

an input terminal to which the collector electrode of said master transistor is connected;

a plurality of output terminals, each respective output terminal being connected to a respective one of the collector electrodes of said plurality of slave transistors;

a common terminal to which the emitter electrodes of said master and plurality of slave transistors are each connected;

direct-coupled amplifier means for direct coupling the collector electrode of said master transistor to a circuit node;

a plurality of additional transistors having respective emitter electrodes, each except that of the last being connected to a respective one of all the base electrodes of said slave transistors and that of the last being connected to the base electrode of said master transistor, and having respective base and collector electrodes;

means for making forward biasing current available from said circuit node to the base electrodes of said additional transistors, including a plurality of resistors having respective first ends connected to said circuit node and having respective second ends each being connected to a respective one of all the base electrodes of said plurality of additional transistors, and means connected to the base electrodes of each of said additional transistors, except the last, for selectively diverting its forward biasing current from it.

2. A switched current amplifier as set forth in claim 1 wherein said means for selectively diverting forward biasing comprises a plurality of switch means, each selectively connecting a respective one of the respective base electrodes of said additional transistors, except the last, to said common terminal.

3. A switched current amplifier according to claim 1 wherein the collector electrodes of said additional transistors are connected to said circuit node.

4. A switch current amplifier according to claim 3 wherein said plurality of resistors are fabricated as pinch resistors.

5. A switched current amplifier according to claim 4 wherein said transistors have like common-emitter forward current gains and the ratio of the resistance of each of said plurality of resistors to the common-emitter forward current gains of the transistors is essentially equal to the sum of the forward-biased base-emitter voltage drops of the additional transistor whose base it forward biases and of the transistor whose base its emitter subsequently forward biases, divided by the collector-emitter current of the latter transistor at times when forward biasing is not removed.

6. A switched current amplifier according to claim 1 wherein the collector electrodes of said additional transistors are connected to a source of operating potential.

7. A switched current amplifier according to claim 1 wherein the collector electrode of said last additional transistor is connected to the collector electrode of said master transistor, and wherein each respective collector electrode of each remaining one of said plurality of additional transistors is connected to the respective collector electrode of the slave transistor to whose base its emitter connects.

8. A switched current amplifier according to claims 3, 6 or 7 wherein said direct-coupled amplifier means comprises a further transistor in follower connection having its input electrode connected to the collector electrode of said master transistor and having its common electrode connected to said circuit node.

9. A switched current amplifier according to claim 3, 6, or 7 further including:

means for providing a reference current to said input terminal; and a plurality of light emitting diodes, each of said light emitting diodes arranged for being supplied operating current from a respective output terminal.

10. An improved light emitting diode display system comprising, in combination:

a plurality of light emitting diodes arranged as segments of a display, each having respective first and second electrodes;

means for supplying an operating potential between first and second supply terminals, the first electrodes of said light emitting diodes connecting to said first supply terminal;

means for supplying a reference current to control the brightness of said light emitting diodes;

means for supplying a plurality of control signals, one for each of said light emitting diodes, and a switched current amplifier having an input terminal for receiving said reference current, having a plurality of output terminals connected to respective ones of the second electrodes of said light emitting diodes, having a common terminal connected to said second supply terminal, and having a respective control terminal associated with each of its output terminals to which a respective one of said control signals is applied, said light emitting diode display system being improved in that said switched current amplifier includes:

a master transistor and a plurality of slave transistors, one for each of said output terminals, each of said transistors having respective emitter, base and collector electrodes, the collector electrode of said master transistor being connected to said input terminal, a respective one of the collector electrodes of said plurality of slave transistors being connected to each respective output terminal, and the emitter electrodes of said master and plurality of slave transistors each being connected to said common terminal;

direct-coupled amplifier means for direct coupling the collector electrode of said master transistor to a circuit node;

a plurality of additional transistors having respective emitter electrodes, each except that of the last being connected to a respective one of all the base electrodes of said slave transistors and that of the last being connected to the base electrode of said master transistor, and having respective base and collector electrodes;

means for making forward biasing current available from said circuit node to the base electrodes of said additional transistors, including a plurality of resistors having respective first ends connected to said circuit node and having respective second ends each being connected to a respective one of all the base electrodes of said plurality of additional transistors, and means connected to the base electrodes of each of said additional transistors, except the last, for selectively diverting its forward biasing current from it responsive to a respective one of said control signals received via a respective one of said control terminals.

11. An improved LED display system as set forth in claim 10 wherein said means for selectively diverting forward biasing comprises
a plurality of switch means, each selectively connecting respective one of the respective base electrodes of said additional transistors, except the last, to said common terminal.

12. An improved LED display system according to claim 10 wherein the collector electrodes of said additional transistors are connected to said circuit node.

13. An improved LED display system according to claim 12 wherein said plurality of resistors are fabricated as pinch resistors.

14. An improved LED display system according to claim 13 wherein said transistors have like common-emitter forward current gains and the ratio of the resistance of each of said plurality of resistors to the common-emitter forward current gains of the transistors is essentially equal to the sum of the forward-biased base-emitter voltage drops of the additional transistor whose base it forward biases and of the transistor whose base its emitter subsequently forward biases, divided by the collector-emitter current of the latter transistor at times when forward biasing is not removed.

15. An improved LED display system according to claim 10 wherein the collector electrodes of said additional transistors are connected to a source of operating potential.

16. An improved LED display system according to claim 10 wherein the collector electrode of said last additional transistor is connected to the collector electrode of said master transistor, and wherein each respective collector electrode of each remaining one of said plurality of additional transistors is connected to the respective collector electrode of the slave transistor to whose base its emitter connects.

17. An improved LED display system according to claims 12, 15 or 16 wherein said direct-coupled amplifier means comprises a further transistor in follower connection having its input electrode connected to the collector electrode of said master transistor and having its common electrode connected to said circuit node.

* * * * *